(12) United States Patent
Jung

(10) Patent No.: US 7,279,734 B2
(45) Date of Patent: Oct. 9, 2007

(54) MOS TRANSISTOR

(75) Inventor: Jin Hyo Jung, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 61 days.

(21) Appl. No.: 10/971,828

(22) Filed: Oct. 21, 2004

(65) Prior Publication Data

US 2005/0087777 A1  Apr. 28, 2005

(30) Foreign Application Priority Data

Oct. 23, 2003  (KR) .................. 10-2003-0074439
Oct. 23, 2003  (KR) .................. 10-2003-0074440

(51) Int. Cl.
    *H01L 29/76*  (2006.01)
(52) U.S. Cl. ..................... 257/314; 257/365
(58) Field of Classification Search .............. 257/365, 257/366, 368, 369, 314, 401
    See application file for complete search history.

(56) References Cited

U.S. PATENT DOCUMENTS

| | | | |
|---|---|---|---|
| 5,047,816 A | | 9/1991 | Cuevas |
| 5,920,085 A | * | 7/1999 | Han et al. ................ 257/66 |
| 6,060,346 A | * | 5/2000 | Roh et al. ............... 438/200 |
| 6,133,098 A | | 10/2000 | Ogura et al. |
| 6,262,445 B1 | * | 7/2001 | Swanson et al. ........... 257/288 |
| 6,388,293 B1 | * | 5/2002 | Ogura et al. ............. 257/365 |
| 6,563,151 B1 | * | 5/2003 | Shin et al. .............. 257/288 |
| 6,613,637 B1 | * | 9/2003 | Lee et al. .............. 438/301 |
| 6,734,510 B2 | * | 5/2004 | Forbes et al. ............ 257/407 |
| 2004/0185630 A1 | * | 9/2004 | Forbes et al. ............ 438/304 |

FOREIGN PATENT DOCUMENTS

KR   10-1999-49782   7/1999

OTHER PUBLICATIONS

Hiromasa NODA et al.; Threshold Voltage Controlled 0.1-um MOSFET Utilizing Inversion Layer as Extreme Shallow Source/Drain; IEDM 93, Tech. Dig., pp. 123 to 126; Published in 1993.
Abstract of Korean Patent Publication: MOSFET Device in Which a Spacer of a Gate Poly is Solicided and Method for Manufacturing the Same: Application No. 10-1997-0088779; Publication Date Jul. 5, 1999.

* cited by examiner

*Primary Examiner*—Wai-Sing Louie
*Assistant Examiner*—Mursalin B. Hafiz
(74) *Attorney, Agent, or Firm*—Andrew D. Fortney

(57) ABSTRACT

The present invention relates to a MOS transistor which is capable of compensating the shortcomings of the conventional MOS transistor having three gate electrodes. In order to achieve the object the MOS transistor of the present invention is characterized in that the sidewall gates are made of material having an energy band gap higher than that of the material constituting the main gate or the sidewall gates are implanted with holes (or positive charges) or electrons (or negative charges). The MOS transistor of the present invention includes a gate dielectric layer formed on a semiconductor substrate at a predetermined width, a main gate formed onto a middle of the gate dielectric layer at a width narrower than that of the gate dielectric layer, sidewall insulators formed on both sides of the main gate, sidewall gates formed on the sidewall insulators and the gate dielectric layer extended outward the main gate, the sidewall gates being injected by holes or electrons, and source/drain regions formed outward the sidewall gates within the semiconductor substrate.

19 Claims, 1 Drawing Sheet

MOS TRANSISTOR

BACKGROUND OF THE INVENTION (a) Field of the Invention

The present invention relates to a MOS transistor structure and, in particular, to a MOS transistor structure having three gate electrodes.

(b) Description of the Related Art

A conventional MOS transistor structure having three gate electrodes has been disclosed in "Threshold voltage adjusted-0.1 μm MOSFET using an inversed layer as very shallow source/drain" by H. Noda, F. Murai, and S. Kimura, IEDM Tech. Dig., 1993, pp. 123~126.

Also, the U.S. Pat. Nos. 6,133,098 and 5,047,816 have been disclosed conventional MOS transistor fabrication techniques.

FIG. 1 shows a conventional MOS transistor structure having three gate electrodes. In case of NMOS, as shown in FIG. 1, a gate oxide layer 5 and a polysilicon main gate 8 doped with N-type impurity of high concentration are sequentially formed on a P-type silicon substrate 1.

Between sidewall gates 7 and the main gate 8, oxide layers 6 are formed so as to electrically isolate the sidewall gates 7 and the main gate 8 from each other, and the gate oxide layer 5 is between the sidewall gate 7 and the P-type silicon substrate 1.

A source 2 and a drain 3 are formed outward the sidewall gate 7 within the semiconductor substrate.

In case of PMOS, the entire structure is identical with the NMOS except for the conductive type of the impurity.

If a voltage is regularly applied to the above structure sidewall gates, the inversed layer below the sidewall gates acts as source/drain extension areas. In the meantime, if the voltage is applied to the main gate, a channel is formed such that the electric current flows from the drain to the source.

Since the sidewall gates are used for forming the virtual source/drain extension areas, the source/drain extension area can be formed at a junction depth of 5~10 nm, thereby it is possible to efficiently improve a short channel effect such as a drain induced barrier lowering (DIBL) and a threshold voltage reduction effect which occurs by penetration of the drain electric field to the channel.

In case of forming the source/drain extension region through the conventional ion implantation process, however, the implanted impurity spreads into the channel region, thereby the source and drain are coupled if the gate length is below 0.06 μm. Even when the gate length is longer than 0.06 μm it is impossible to form the source/drain junction at the depth below 10 nm, resulting in occurrence of the severe short channel effect.

As an alternative to the technique for forming the source/drain extension region of the nano-transistor below 0.1 μm, a virtual source/drain extension region structure using the sidewall gates has been interested.

In order to regularly apply the voltage to the sidewall gates of the conventional MOS transistor structure having three gate electrodes, contacts should be formed at the sidewall gates, which is difficult. Also, the ions injected for the purpose to adjust the threshold voltage of the sidewall gates may spread in the following thermal treatment process so as to make an effect to the threshold voltage of the main gate region.

Furthermore, there can be parasitic capacitances between the sidewall gate and the main gate, between the sidewall gate and the body, and between the sidewall gate and the source/drain, that make slow the transfer speed of the sidewall gate bias voltage so as to degrade transistor performance.

Also, the voltage regularly applied to the sidewall gates causes additional leakage current so as to increase the power consumption and deteriorate the isolation layer between the sidewall gate and the main gate.

SUMMARY OF THE INVENTION

The present invention has been made in an effort to solve the above problems, and it is an object of the present invention to provide a novel structured MOS transistor which is capable of compensating the shortcomings of the conventional MOS transistor having three gate electrodes.

In order to achieve the above object, the MOS transistor of the present invention includes a main gate and sidewall gates, characterized in that the sidewall gates are made of material having an energy band gap higher than that of the material constituting the main gate or the sidewall gates are implanted with holes (or positive charges) or electrons (or negative charge).

Also, the sidewall gates can be formed of the material having an energy band gap higher than that of the material forming the main gate and simultaneously injected with the holes (or the positive charges) or the electrons (or the negative charges).

That is, the MOS transistor according to the present invention includes a gate dielectric layer formed on a semiconductor substrate at a predetermined width, a main gate formed onto a middle of the gate dielectric layer at a width narrower than that of the gate dielectric layer, sidewall insulators formed on both sides of the main gate, sidewall gates formed on the sidewall insulators and the gate dielectric layer extended outward the main gate, the sidewall gates being injected by holes or electrons, and source/drain regions formed outward the sidewall gates within the semiconductor substrate.

The holes can be replaced by positive charges, and the electrons can be replaced by negative charges.

Preferably, the main gate and the sidewall gates are doped with impurity materials, and the semiconductor substrate is doped with impurity material at areas below the sidewall gates.

Each sidewall insulator has a thickness thinner than that of the gate dielectric layer outside the main gate and has an electric permittivity higher than that of the gate dielectric layer outside the main gate.

Each sidewall gate is made of a semiconductor material having an energy band gap higher than that of a material forming the main gate, e.g., the main gate is made of a polysilicon, and the sidewall gate is made of one of GaAs, $Al_xGa_{1-x}As$, AlAs, CdSe, GaP, $GaAs_{1-x}P_x$, CdS, SiC, and ZnS.

In another aspect of the present invention, the MOS transistor includes a gate dielectric layer formed on a semiconductor substrate at a predetermined width, a main gate formed onto a middle of the gate dielectric layer at a width narrower than that of the gate dielectric layer, sidewall insulators formed on both sides of the main gate, sidewall gates formed on the sidewall insulators and the gate dielectric layer extended outward the main gate, the sidewall gates being made of semiconductor material having an energy band gap higher than that of a material forming the main gate, and source/drain regions formed outward the sidewall gates within the semiconductor substrate.

DETAILED DESCRIPTION OF THE PREFERRED EMBODIMENTS

A preferred embodiment of the present invention will be described hereinafter with reference to the accompanying drawings.

Figure 1:
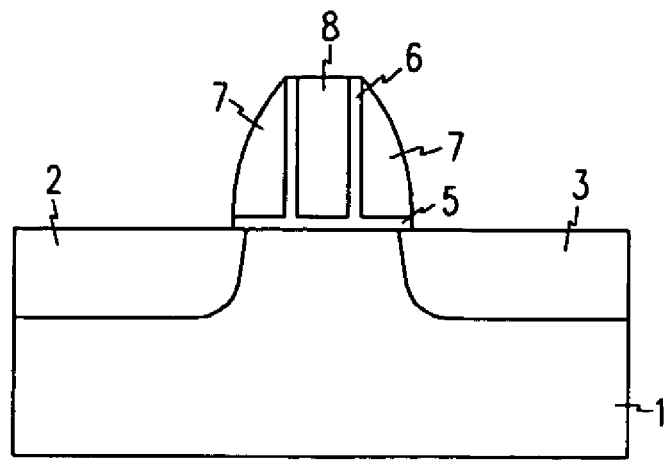
FIG. 1 is a cross sectional illustrating a conventional MOS transistor structure having three gate electrodes.
Figure 2:
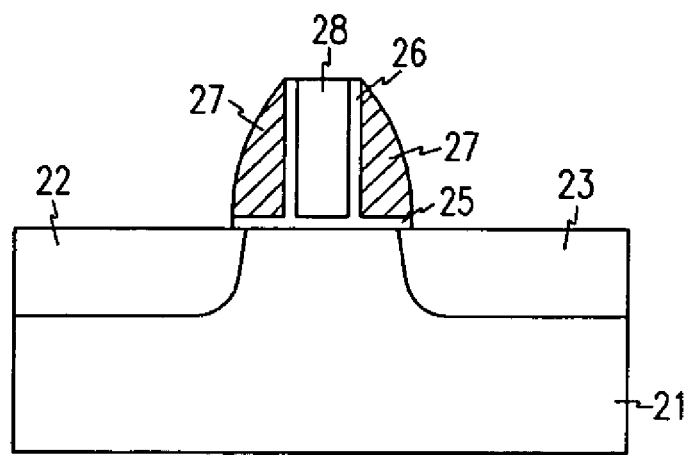
FIG. 2 is a cross sectional illustrating a MOS transistor structure having three gate electrodes according to a preferred embodiment of the present invention.

FIG. 2 is a cross sectional view illustrating a MOS transistor according to the present invention. As shown in FIG. 2, a gate dielectric layer 25 is formed at a predetermined width on a semiconductor substrate 21, and a main gate 28 is formed on the center of the gate dielectric layer 25, the width of the main gate 28 being narrower than that of the gate dielectric layer 25.

On the both sidewalls of the main gate 28, sidewall insulators 26 are formed, and sidewall gates 27 are formed at corners formed by boundary regions of the gate dielectric layer 25, on which the main gate 28 is not doped, and the sidewall insulators 26. The sidewall gates 27 located at the both sides of the main gate 28 are provided with holes and electrons.

Instead of the holes and electrons, positive and negative charges can be injected to the sidewalls 27.

Also, the sidewall gates 27 is made from a semiconductor material of which energy band gap is greater than that of the material of main gate 28.

In this manner, the sidewall gate 27 can be made of semiconductor material having the energy band gap greater than that of the material of the main gate 28, after the holes and electrons being injected into the sidewall gate. Also, the sidewall gates 27 can be made of semiconductor material having the energy band gap greater than that of the material of the main gate 28, without injection of the holes and electrons.

At both sides of the sidewall gates a source region 22 and a gate region 23 are formed within the semiconductor substrate 21.

As described above, the MOS transistor structure of the present invention uses the polysilicon, as the sidewall gates, doped with highly concentrated n-type impurity (p-type in case of PMOS) and injected by holes and electrons, uses the semiconductor material doped with n-type impurity (p-type in case of PMOS) of having high energy band gap, or uses the semiconductor material having the high energy band gap as well as being injected with the holes and electrons, in place of the highly concentrated conventional polysilicon.

Typically, the threshold voltage of the long channel MOS transistor can be presented as following equation 1.

$$V_t = \phi_{ms} + 2\phi_f - \frac{Q_d}{C_{ox}} + \frac{q(D_p - D_n)}{C_{ox}} - \frac{Q_t}{C_{ox}} \qquad \text{Equation 1}$$

where $\phi_{ms}$ is difference of the work function [V], $\phi_f$ is Fermi potential [V], $Q_d$ is a charge amount of depletion region [C/cm$^3$], $C_{ox}$ is a gate oxide capacitance, q is a charge mount of the electron [C], $D_p$ is a threshold voltage adjustment dose amount of p-type dopant [cm$^{-2}$], $D_n$ is a threshold voltage adjustment dose amount of n-type dopant[cm$^{-2}$], and $Q_t$ is a charge trapped in the sidewall gate potential well [C/cm$^3$].

In case of using the typical high concentrated N+ polysilicon gate, the difference of the work functions is about −1.0 V and the Fermi potential is in the range of 0.4-0.45 V, that is almost fixed value, such that the charge amount of the depletion region should be controlled by adjusting the concentration of the silicon substrate or injecting the N— or P-type impurity into the surface of the silicon substrate in order to adjust the threshold voltage.

For example, the threshold voltage of the long native NMOS transistor on the silicon semiconductor without injecting the N- or P-type impurity is approximately 0.1 V and in case of the transistor having a short channel may have relatively low threshold voltage, when the high concentrated n+ polysilicon gate is used, the concentration of to silicon substrate is 1.0×10$^{17}$ [ions/cm$^3$], and the thickness of the gate oxide layer is 50 Å, the threshold voltage of the long native NMOS transistor on the silicon semiconductor without injecting the N- or P-type impurity is approximately 0.1 V and the transistor of short channel has somewhat low threshold voltage.

Accordingly, only when a voltage much higher than the threshold voltage, i.e., about 2~3V is applied, the positively inversed layer is formed enough below the sidewall gates so as to form the source/drain extension regions.

In order to increase the threshold voltage in the above described conditions, the p-type impurity is implanted onto the surface of the silicon substrate. On the other hand, the n-type impurity is injected onto the surface of the silicon substrate to decrease the threshold voltage.

However, the implantation of the impurity for adjusting the threshold voltage may change the threshold voltage of the main gate due to the diffusion of the implanted impurity in a following thermal process. Furthermore, even when the n-type impurity is implanted onto the surface of the silicon substrate, it is difficult to decrease the threshold voltage below −1V to −2V. Thus, the required source/drain extension regions can be achieved by absolutely applying the voltage to the sidewall gates in the conventional structure.

However, the holes (or positive charges) are injected into the highly concentrated n-type polysilicon constituted of the sidewall gates as in the present invention, the injected holes (or positive charges) are isolated in an electric potential well between the sidewall gate (polysilicon) and the gate dielectric layer (oxide layer) and a flat band voltage decreases such that the threshold voltage of the sidewall gates can be decreased below a required voltage.

Exemplary, the threshold voltage of the long channel native NMOS transistor without injecting n- or p- type impurity onto the surface of to silicon substrate is approximately −5V, when a highly concentrated n+ polysilicon sidewall gates are used, the concentration level of the silicon substrate is 1.0×10$^{17}$ [ions/cm$^3$], the thickness of the gate oxide layer is 90 Å, and the holes (or positive charges) are injected into the highly concentrated n+ polysilicon sidewall gates at the amount of 2.0×10$^{16}$ [ions/cm$^3$].

Accordingly, by implanting the holes (or the positive charges) into the electric potential well of the n+ polysilicon sidewall gates, it is possible to obtain the threshold voltage much lower than 0V in the native state, thereby the inverse layer is formed below the sidewall gates, without applying the bias to the sidewall gates, so as to form the source/drain extension regions.

Here, since the threshold voltage can be changed as much as required by adjusting the amount of the holes (or the positive charges) injected into the electric potential well of the n+ polysilicon sidewall gate, a high performance transistor can be implemented by increasing the injected holes (or the positive charges) so as to decrease the threshold voltage of the sidewall gates to the very low level, thereby the size of the inversed layer increases and the parasite resistance of the source/drain extension region decreases.

In the meantime, a low leakage transistor can be fabricated by increasing the parasite resistance of the source/drain extension regions. In order to increase the source/drain extension regions, the size of the inversed layer is reduced by decreasing the injected holes (or positive charges) so as to increase the threshold voltage of the sidewall gate.

In another way, by using a semiconductor having a band gap which is much higher than 1.1 eV of the silicon energy band gap such as GaAs (approximately 1.43 eV), $Al_xGa_{1-x}As$ (1.43~2.16 eV), AlAs (approximately 2.16 eV), CdSe (approximately 1.7 eV), GaP (approximately 2.26 eV), $GaAs_{1-x}P_x$ (1.43~2.26 eV), CdS (approximately 2.4 eV), SiC (approximately 2.9 eV), and ZnS (approximately 3.6 eV) in place of the conventional highly concentrate n-type polysilicon (highly concentrated p-type polysilicon in case of PMOS), and doping the n-type impurity at the high concentration level, the work function difference increases as much as half of the band gap difference.

Exemplary, in case of using the highly concentrated n-type GaP in place of the highly concentrated n-type polysilicon, the work function differences of the respective cases using the highly concentrate conventional n-type polysilicon and the highly concentrated n-type GaP are −0.96V and −1.53V, respectively. Also, in case of using the highly concentrated n-type ZnS, it becomes −2.2V. Accordingly, in case of the long channel native NMOS using the highly concentrated n-type GaP, the threshold voltage becomes approximate −0.5V. In the meantime, in case of using the short channel native NMOS, the threshold voltage becomes somewhat lower than that in case of the long channel native NMOS.

By using the semiconductor having the high energy band gap as the sidewall gates, it is possible to obtain the threshold voltage much lower than 0V in the native state. Accordingly, the inversed layers are always formed below the sidewall gates without applying bias to the sidewall gates, resulting in implementation of the source/drain extension regions.

Furthermore, by reducing the thickness of the sidewall gate oxide layer or using the material having high electric permittivity, it is possible to avoid the increase of the threshold voltage caused by the quantity of the electric charge at the depletion region.

In order to further reduce the threshold voltage, a count-doping can be additionally carried out below the sidewall gates. Here, the count-doping is a process to reduce the threshold voltage of the NMOS or PMOS by injecting the p-type impurity ions onto the surface of the channel regions in case of NMOS and injecting the n-type impurity ions onto the surface of the channel regions in case of PMOS.

In case of performing the count doping, since the impurity ions injected through the count doping diffuses into the main gate region in following thermal process so as to change the threshold voltage of the main gate region such that it is difficult to adopt the count doping to the nano-transistor, but the threshold voltage can be controlled by adjusting the amount of the holes injected to the electric potential well of the sidewall gate. Accordingly, the count doping process is not required.

Also, the voltage applied to the main gate induces a predetermined voltage to the sidewall gates by coupling the sidewall gate dielectric oxide layer 26 and the sidewall gate oxide layer 25, such that it is possible to induce the voltage higher than 0.5 times of the voltage induced to the main gate by increasing the coupling ratio over 0.5 by forming the sidewall gate dielectric oxide layer at a thickness thinner than the sidewall gate oxide layer or using the dielectric materials such that the permittivity of sidewall gate dielectric oxide layer is greater than that of the side wall gate oxide layer.

Accordingly, the voltage induced to the sidewall gates increases the inversed layers below the sidewall gates to further decrease the value of the parasite resistance of the source/drain extension regions such that much current flows in the ON state and the voltage is not induced to the side wall gate in the OFF state so as to increase the parasite resistance at the source/drain extension regions, resulting in further reduction of the current flow in the OFF state.

In the present invention, the source/drain extension regions can be obtained by forming the inversed layers below the sidewall gates without applying bias to the sidewall gates, since the sidewall gate threshold voltage can be decreased to the required level, by injecting the holes (or the positive charges) into the polysilicon electric potential well doped with the highly concentrated n-type impurity, which is used for sidewall gates of conventional NMOS, or by using a semiconductor doped with respective n- and p-type impurity, of which energy band gap is higher than that of the silicon, in place of the polysilicon doped with the highly concentrated n-type impurity for the sidewall gate of the conventional NMOS or the polysilicon doped with the highly concentrated p-type impurity for sidewall gate of PMOS.

In order to improve the current reduction effect caused by the parasitic resistance in the source/drain extension regions by increasing the size of the inversed layer by further decreasing the threshold voltage, the threshold voltage can be further reduced by performing the count doping below the sidewall gates, and the size of the inversed layer can be dynamically adjusted according to the ON or OFF state by adjusting the coupling between the sidewall gate dielectric oxide layer 26 and the sidewall gate oxide layer 25 so as to induce the voltage applied to the main gate to sidewall gate at a predetermined level such that the size of the inversed layer increases in the ON state to further reduce the parasitic resistance at the source/drain regions and decreases in the OFF state to increase the parasitic resistance at the source/drain regions.

As described above, the source/drain extension regions, in the present invention, are implemented by forming the inversed layers below the sidewall gates without applying bias to the sidewall gates such that it is not required to form the contacts for additional bias, thereby it is possible to simplify the manufacturing process and reduce the size of the transistor.

Also, the present invention does not require the impurity ion injection process for reducing the threshold voltage of the sidewall gates, it is possible to avoid the variation of the main gate caused by the impurity ion injection. Furthermore, since there is no need to apply the bias to the sidewall gate, it is possible to avoid the occurrence of parasitic capacitances between the sidewall gate and the main gate, between the sidewall gate and the body, and the sidewall gate and the source/drain, that make slow the transfer speed of the sidewall gate bias voltage so as to degrade transistor performance.

Furthermore, in the present invention, the voltage induced to the sidewall gates increases the inversed layers below the sidewall gates to further decrease the value of the parasite resistance of the source/drain extension regions such that much current flows in the ON state and the voltage is not induced to the side wall gate in the OFF state so as to increase the parasite resistance at the source/drain extension regions, resulting in further reduction of the current flow in the OFF state. Accordingly, it is possible to implement a high performance transistor which is capable of maximizing the current in ON state and minimizing the leakage current in OFF state by minimizing the off current.

What is claimed is:

1. A MOS transistor comprising:
a gate dielectric layer on a semiconductor substrate at a predetermined width;
a main gate comprising polysilicon, on a middle of the gate dielectric layer at a width narrower than that of the gate dielectric layer;
sidewall insulators on both sides of the main gate;
sidewall gates on the sidewall insulators and the gate dielectric layer extending outward from the main gate, the sidewall gates comprising GaAs, $Al_xGa_{1-x}As$, AlAs, CdSe, GaP, $GaAs_{1-x}P_x$, CdS, SiC, or ZnS, and being injected by holes or electrons; and
source regions and drain regions outward from the sidewall gates within the semiconductor substrate.

2. The MOS transistor of claim 1, wherein the holes can be replaced by positive charges, and the electrons can be replaced by negative charges.

3. The MOS transistor of claim 2, wherein the sidewall gates comprises highly concentrated n+ polysilicon.

4. The MOS transistor of claim 3, wherein the sidewall gates have a concentration of holes or positive charges of $2.0 \times 10^{16}$ ions/cm$^3$.

5. The MOS transistor of claim 4, wherein the semiconductor substrate comprises silicon having impurities at a concentration of $1.0 \times 10^{17}$ ions/cm$^3$.

6. The MOS transistor of claim 1, wherein the main gate comprises polysilicon doped with an impurity.

7. The MOS transistor of claim 1, wherein the sidewall gates comprise a second material doped with an impurity.

8. The MOS transistor of claim 1, wherein the semiconductor substrate is doped with an impurity at areas below the sidewall gates.

9. The MOS transistor of claim 1, wherein each sidewall insulator has a thickness narrower than that of the gate dielectric layer outside the main gate.

10. The MOS transistor of claim 1, wherein each sidewall insulator has an electric permittivity higher than that of the gate dielectric layer outside the main gate.

11. The MOS transistor of claim 1, wherein each sidewall gate comprises a semiconductor material having an energy band gap higher than that of a material forming the main gate.

12. The MOS transistor of claim 1, wherein the sidewall gates enable forming an inversed layer below the sidewall gates without applying a bias to the sidewall gates.

13. A MOS transistor comprising:
a gate dielectric layer on a semiconductor substrate at a predetermined width;
a main gate comprising polysilicon, on a middle of the gate dielectric layer at a width narrower than that of the gate dielectric layer;
sidewall insulators on both sides of the main gate;
sidewall gates on the sidewall insulators and the gate dielectric layer extending outward from the main gate, the sidewall gates comprising GaAs, $Al_xGa_{1-x}As$, AlAs, CdSe, GaP, $GaAs_{1-x}P_x$, CdS, or ZnS and providing a work function difference sufficient to reduce a threshold voltage of the MOS transistor; and
source and drain regions outward from the sidewall gates within the semiconductor substrate.

14. The MOS transistor of claim 13, wherein the main gate comprises a first material doped with an impurity.

15. The MOS transistor of claim 13, wherein the sidewall gates comprise a second material doped with an impurity.

16. The MOS transistor of claim 13, wherein the semiconductor substrate is doped with an impurity at areas below the sidewall gates.

17. The MOS transistor of claim 13, wherein each sidewall insulator has a thickness narrower than that of the gate dielectric layer outside the main gate.

18. The MOS transistor of claim 13, wherein each sidewall insulator has an electric permittivity higher than that of the gate dielectric layer outside the main gate.

19. The MOS transistor of claim 13, wherein the sidewall gates enable forming an inversed layer below the sidewall gates without applying a bias to the sidewall gates.

* * * * *